(12) United States Patent
Liu et al.

(10) Patent No.: US 11,018,209 B2
(45) Date of Patent: May 25, 2021

(54) DISPLAY SUBSTRATE, DISPLAY APPARATUS, AND METHOD OF FABRICATING DISPLAY SUBSTRATE

(71) Applicant: BOE TECHNOLOGY GROUP CO., LTD., Beijing (CN)

(72) Inventors: Fengjuan Liu, Beijing (CN); Youngsuk Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 495 days.

(21) Appl. No.: 15/774,921

(22) PCT Filed: Nov. 2, 2017

(86) PCT No.: PCT/CN2017/109077
§ 371 (c)(1),
(2) Date: May 9, 2018

(87) PCT Pub. No.: WO2018/205511
PCT Pub. Date: Nov. 15, 2018

(65) Prior Publication Data
US 2020/0295099 A1 Sep. 17, 2020

(30) Foreign Application Priority Data
May 12, 2017 (CN) .......................... 201710333740.0

(51) Int. Cl.
*H01L 27/32* (2006.01)
*H01L 51/52* (2006.01)
*H01L 51/56* (2006.01)

(52) U.S. Cl.
CPC ........ *H01L 27/3246* (2013.01); *H01L 27/322* (2013.01); *H01L 27/3262* (2013.01);
(Continued)

(58) Field of Classification Search
CPC ............. H01L 27/3246; H01L 27/3262; H01L 51/5284; H01L 27/322; H01L 27/3272; H01L 51/56
See application file for complete search history.

(56) References Cited

U.S. PATENT DOCUMENTS 7,791,267 B2 * 9/2010 Baek ................... H01L 27/3276
313/504
2004/0222999 A1 11/2004 Choi et al.
(Continued)

FOREIGN PATENT DOCUMENTS

CN 101626029 A 1/2010
CN 104465701 A 3/2015
(Continued)

OTHER PUBLICATIONS

First Office Action in the Chinese Patent Application No. 201710333740. 0, dated Mar. 4, 2020; English translation attached.
(Continued)

*Primary Examiner* — Dung A. Le
(74) *Attorney, Agent, or Firm* — Intellectual Valley Law, P.C.

(57) ABSTRACT

The present application discloses a display substrate. The display substrate includes a base substrate; a plurality of thin film transistors for driving image display on the base substrate; a planarization layer on a side of the plurality of thin film transistors distal to the base substrate; and a pixel definition layer defining a plurality of subpixel regions. The display substrate includes a recess extending into the planarization layer and in an inter-subpixel region of the display substrate. The display substrate further includes a recess fill layer in the recess. The recess fill layer has a light transmittance rate lower than that of the planarization layer.

17 Claims, 6 Drawing Sheets

(52) U.S. Cl.
CPC ...... *H01L 27/3272* (2013.01); *H01L 51/5284* (2013.01); *H01L 51/56* (2013.01)

(56) References Cited

U.S. PATENT DOCUMENTS

| | | | |
|---|---|---|---|
| 2010/0007271 | A1 | 1/2010 | Lee et al. |
| 2010/0102301 | A1 | 4/2010 | Yang et al. |
| 2010/0330468 | A1 | 12/2010 | Kwon et al. |
| 2013/0099221 | A1 | 4/2013 | Kawamura et al. |
| 2014/0346449 | A1 | 11/2014 | Choi et al. |
| 2015/0017752 | A1 | 1/2015 | Kim et al. |
| 2015/0084023 | A1 | 3/2015 | Sato |
| 2017/0200773 | A1 | 7/2017 | Li et al. |
| 2017/0221976 | A1* | 8/2017 | Park ................. H01L 27/3246 |
| 2017/0338284 | A1 | 11/2017 | Tang |
| 2018/0158886 | A1* | 6/2018 | Dong ................. H01L 27/3246 |
| 2018/0259852 | A1 | 9/2018 | Tanigaki et al. |
| 2018/0269267 | A1 | 9/2018 | Ohchi |

FOREIGN PATENT DOCUMENTS

| | | |
|---|---|---|
| CN | 105448825 A | 3/2016 |
| CN | 106019670 A | 10/2016 |
| CN | 205645818 U | 10/2016 |
| CN | 106094326 A | 11/2016 |
| CN | 106094360 A | 11/2016 |
| EP | 1475771 A2 | 11/2004 |
| JP | 2011044271 A | 3/2011 |
| KR | 20100138411 A | 12/2010 |
| KR | 20150006945 A | 1/2015 |
| WO | 2012017498 A1 | 2/2012 |
| WO | 2017024851 A1 | 2/2017 |
| WO | 2017051622 A1 | 3/2017 |
| WO | 2017057281 A1 | 4/2017 |

OTHER PUBLICATIONS

First Office Action in the Korean Patent Application No. 20187017662, dated Apr. 17, 2019; English translation attached.
First Office Action in the Indian Patent Application No. 201827023808, dated Jul. 23, 2020.
Second Office Action in the Chinese Patent Application No. 201710333740.0, dated Aug. 12, 2020.
International Search Report & Written Opinion dated Feb. 13, 2018, regarding PCT/CN2017/109077.
Extended European Search Report in the European Patent Application No. 17885445.1, dated Feb. 2, 2021.

* cited by examiner

DISPLAY SUBSTRATE, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2017/109077, filed Nov. 2, 2017, which claims priority to Chinese Patent Application No. 201710333740.0, filed May 12, 2017, the contents of which are incorporated by reference in the entirety.

TECHNICAL FIELD

The present invention relates to display technology, more particularly, to a display substrate, a display apparatus, and a method of fabricating a display substrate.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

An OLED display apparatus typically includes an anode, an organic layer including an organic light emitting layer, and a cathode. OLEDs can either be a bottom-emission type OLED or a top-emission type OLED. In bottom-emission type OLEDs, the light is extracted from an anode side. In bottom-emission type OLEDs, the anode is generally transparent, while a cathode is generally reflective. In a top-emission type OLED, light is extracted from a cathode side. The cathode is optically transparent, while the anode is reflective.

SUMMARY

In one aspect, the present invention provides a display substrate comprising a base substrate; a plurality of thin film transistors for driving image display on the base substrate; a planarization layer on a side of the plurality of thin film transistors distal to the base substrate; and a pixel definition layer defining a plurality of subpixel regions; wherein the display substrate comprises a recess extending into the planarization layer and in an inter-subpixel region of the display substrate; the display substrate further comprises a recess fill layer in the recess; and the recess fill layer has a light transmittance rate lower than that of the planarization layer.

Optionally, the recess fill layer is in direct contact with the pixel definition layer.

Optionally, the recess fill layer is an integral part of the pixel definition layer extending into the recess.

Optionally, the pixel definition layer extends into the recess to a depth; and a ratio of the depth to a thickness of the planarization layer is in a range of approximately 0.4:1 to approximately 1:1.

Optionally, the recess is a through-hole via extending through the planarization layer.

Optionally, the recess is a blind via partially extending into the planarization layer, and the pixel definition layer is on a side of the planarization layer distal to the plurality of thin film transistors.

Optionally, an orthographic projection of the pixel definition layer on the base substrate substantially covers an orthographic projection of the recess on the base substrate.

Optionally, an orthographic projection of the recess on the base substrate substantially overlaps with an orthographic projection of the pixel definition layer on the base substrate.

Optionally, the recess has a width in a range of approximately 1 µm to approximately 30 µm.

Optionally, the display substrate further comprises a plurality of organic light emitting diodes respectively in the plurality of subpixel regions; wherein each of the plurality of organic light emitting diodes comprises a first electrode on the planarization layer; an organic light emitting layer on a side of the first electrode distal to the planarization layer; and a second electrode on a side of the organic light emitting layer distal to the first electrode.

Optionally, the display substrate is a bottom emission type display substrate; and light emitted from the organic light emitting layer emits out of the display substrate from the base substrate along a direction away from the planarization layer.

Optionally, the display substrate further comprises a color filter between the planarization layer and the base substrate; wherein the color filter comprises a plurality of color filter blocks, each of which substantially in one of the plurality of subpixel regions; the light emitted from the organic light emitting layer is a white light.

Optionally, the pixel definition layer is made of a light shielding material.

In another aspect, the present invention provides a display apparatus comprising the display substrate described herein or fabricated by a method described herein.

In another aspect, the present invention provides a method of fabricating a display substrate, comprising forming a plurality of thin film transistors for driving image display of the display substrate on a base substrate; forming a planarization layer on a side of the plurality of thin film transistors distal to the base substrate; and forming a pixel definition layer defining a plurality of subpixel regions; wherein the display substrate is formed to comprise a recess extending into the planarization layer and in an inter-subpixel region of the display substrate; and the method further comprises forming a recess fill layer in the recess; and the recess fill layer is formed to have a light transmittance rate lower than that of the planarization layer.

Optionally, the recess fill layer is formed to be in direct contact with the pixel definition layer.

Optionally, the recess fill layer is formed as an integral part of the pixel definition layer extending into the recess.

Optionally, forming the planarization layer comprises forming an insulating material layer on a side of the plurality of thin film transistors distal to the base substrate; and removing a portion of the insulating material layer thereby forming the recess and the planarization layer.

Optionally, removing the portion of the insulating material layer to a depth such that a ratio of the depth to a thickness of the insulating material layer is in a range of approximately 0.4:1 to approximately 1:1.

Optionally, the recess is a blind via partially extending into the planarization layer, and removing the portion of the insulating material layer comprises exposing the insulating material layer using a gray-tone or half-tone mask plate, the gray-tone or half-tone mask plate comprises a first section and a second section, a first part of the insulating material layer corresponding to the first section is partially exposed, a second part of the insulating material layer corresponding to the second section is substantially unexposed; and developing the insulating material layer, thereby forming the recess and the planarization layer.

Optionally, the recess is a through-hole via extending through the planarization layer.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Conventional organic light emitting diode substrates include a plurality of subpixel regions defined by a pixel definition layer. The plurality of subpixel regions may emit light of various colors, e.g., a white light, a red light, a green light, and a blue light. In conventional organic light emitting diode substrates, there exists issues of light leakage and color mixing between adjacent subpixel regions. For example, light emitted from a red subpixel region may transmit into an adjacent green subpixel region due to the isotropic nature of light emission, resulting in color mixing in the green subpixel region.

Figure 1:
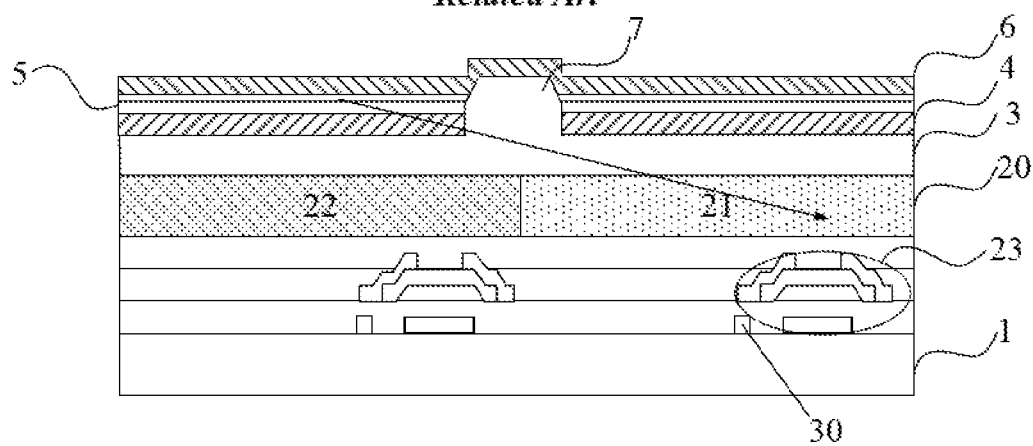
FIG. 1 is a schematic diagram illustrating the structure of a conventional display substrate.
Figure 2:
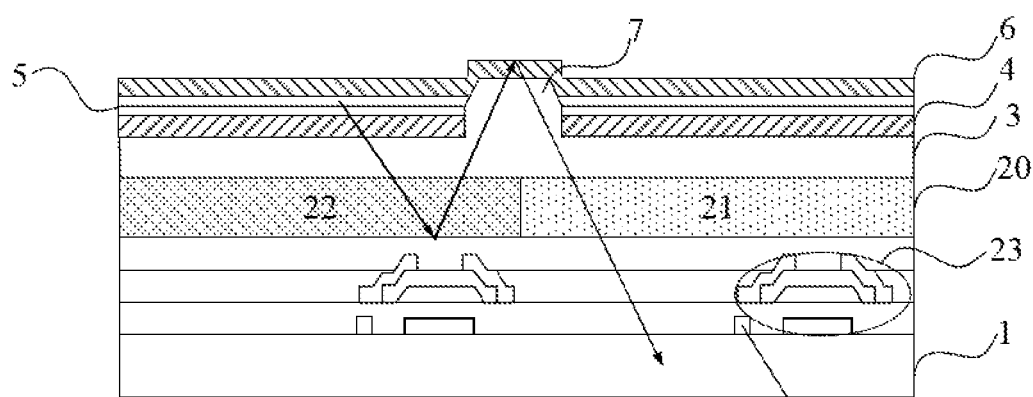
FIG. 2 is a schematic diagram illustrating the structure of a conventional display substrate.
Figure 3:
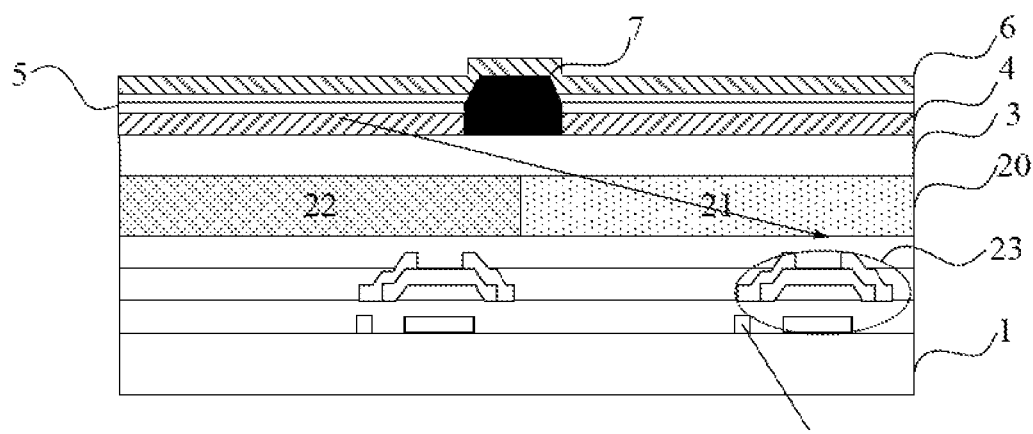
FIG. 3 is a schematic diagram illustrating the structure of a conventional display substrate.

FIGS. 1 to 3 are schematic diagrams illustrating the structures of conventional display substrates. Referring to FIGS. 1 to 3, a conventional organic light emitting diode substrate includes a plurality of subpixel regions defined by the pixel definition layer 7. The plurality of subpixel regions emit light of different colors. As shown in FIG. 1 and FIG. 2, when the pixel definition layer 7 is made of a transparent material, light emitted from one subpixel region transmits into an adjacent subpixel region, resulting in light leakage and color mixing between adjacent subpixel regions. For example, due to the isotropic nature of light emission, light emitted from a red subpixel region 21 may transmit into an adjacent green subpixel region 22 along the light path depicted in FIG. 1 and FIG. 2, resulting in color mixing in the green subpixel region 22. As shown in FIG. 3, these issues remain in an organic light emitting diode substrate having a pixel definition layer 7 made of a non-transparent material.

Accordingly, the present disclosure provides, inter alia, a display substrate, a display apparatus, and a method of fabricating a display substrate that substantially obviate one or more of the problems due to limitations and disadvantages of the related art. In one aspect, the present disclosure provides a display substrate. In some embodiments, the display substrate includes a base substrate; a plurality of thin film transistors for driving image display on the base substrate; a planarization layer on a side of the plurality of thin film transistors distal to the base substrate; and a pixel definition layer defining a plurality of subpixel regions. Optionally, the display substrate includes a recess extending into the planarization layer, the recess is in an inter-subpixel region of the display substrate. In some embodiments, the display substrate further includes a recess fill layer in the recess. Optionally, the recess fill layer has a light transmittance rate lower than that of the planarization layer. Optionally, the recess fill layer is made of a light shielding material. Optionally, the recess fill layer is in direct contact with the pixel definition layer. Optionally, the recess fill layer is an integral part of the pixel definition layer extending into the recess.

As used herein, a subpixel region refers to a light emission region of a subpixel, such as a region corresponding to a pixel electrode in a liquid crystal display or a region corresponding to a light emissive layer in an organic light emitting diode display panel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Figure 4:
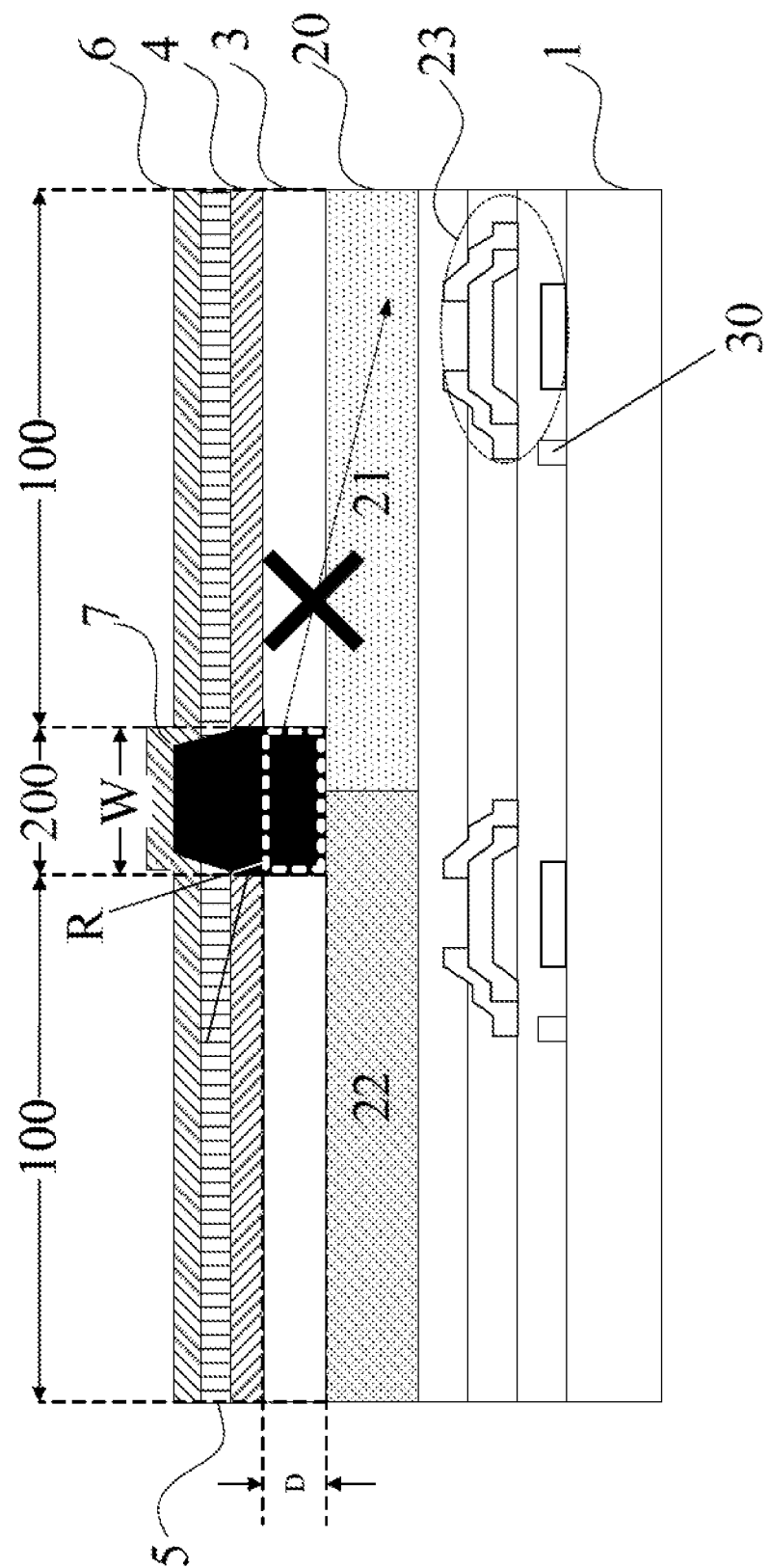
FIG. 4 is a schematic diagram illustrating the structure of a display substrate in some embodiments according to the present disclosure.
Figure 5:
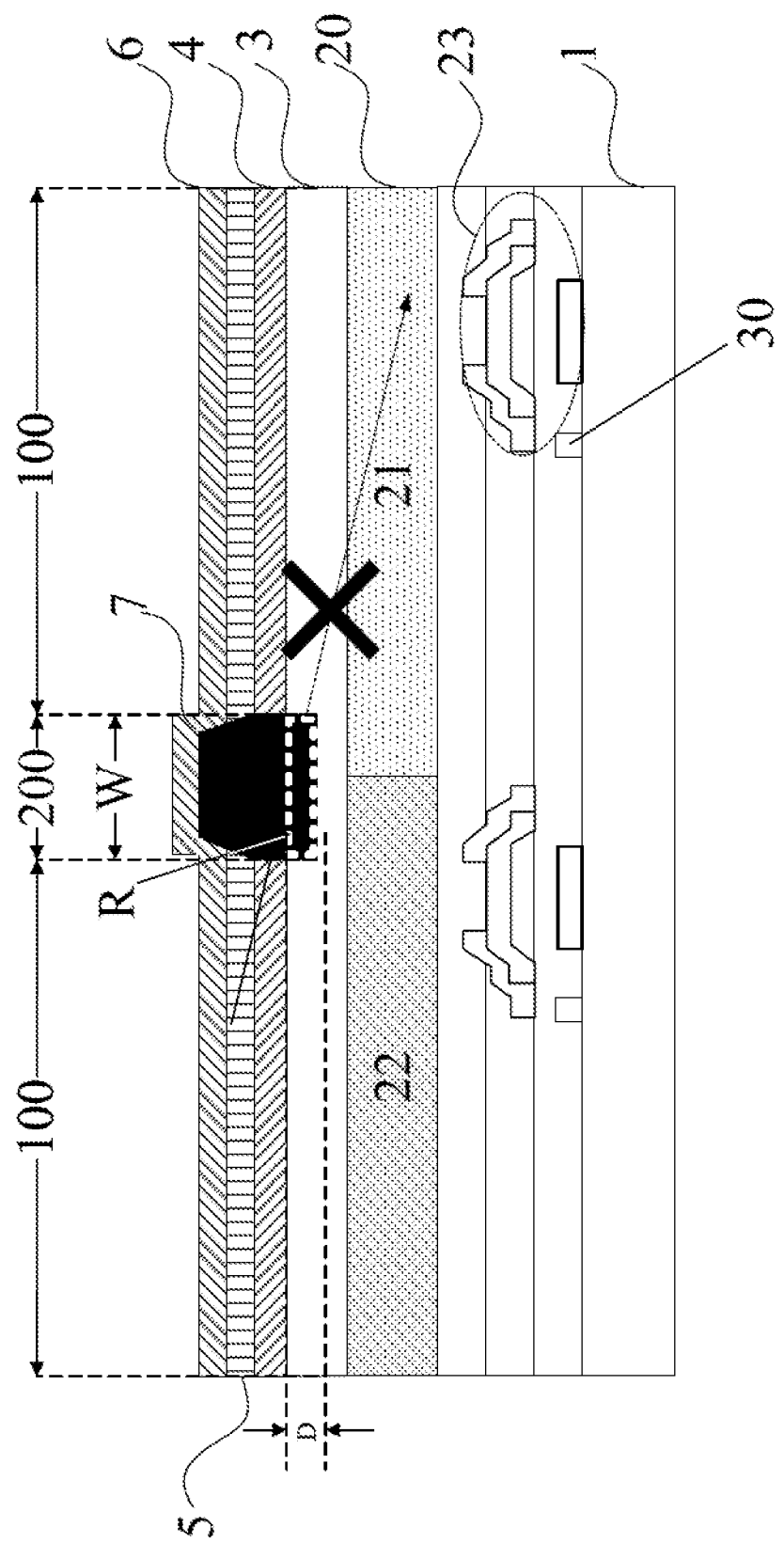
FIG. 5 is a schematic diagram illustrating the structure of a display substrate in some embodiments according to the present disclosure.

FIG. 4 is a schematic diagram illustrating the structure of a display substrate in some embodiments according to the present disclosure. FIG. 5 is a schematic diagram illustrating the structure of a display substrate in some embodiments according to the present disclosure. Referring to FIG. 4 and FIG. 5, the display substrate in some embodiments includes a base substrate 1; a plurality of thin film transistors 23 for driving image display and a plurality of signal lines 30 on the base substrate 1; a planarization layer 3 on a side of the plurality of thin film transistors 23 distal to the base substrate 1; and a pixel definition layer 7 defining a plurality of subpixel regions 100. Optionally, the display substrate includes a recess R extending into the planarization layer 3.

A portion of the pixel definition layer 7 is in the recess R, e.g., the pixel definition layer 7 substantially fills in the recess R. The recess R is in an inter-subpixel region 200 of the display substrate. In some embodiments, an orthographic projection of the pixel definition layer 7 on the base substrate 1 substantially covers an orthographic projection of the recess R on the base substrate 1. Optionally, an orthographic projection of the recess R on the base substrate 1 substantially overlaps with an orthographic projection of the pixel definition layer 7 on the base substrate 1.

In some embodiments, the pixel definition layer 7 extends into the recess R to a depth D substantially blocking light emitted from one of the plurality of subpixel regions 100 from transmitting into an adjacent subpixel region of the plurality of subpixel regions 100. By having this design, light emitted from the one of the plurality of subpixel regions 100 toward the adjacent subpixel region of the plurality of subpixel regions 100 will be blocked (e.g., absorbed or reflected) by a portion of the pixel definition layer 7 in the recess R. Accordingly, light leakage and color mixing among adjacent subpixel regions of the plurality of subpixel regions 100 can be effectively avoided. As used herein, the term "substantially blocking" refers to no more than 0.5% (e.g., no more than 0.2%, no more than 0.1%, no more than 0.05%, no more than 0.02%, and no more than 0.01%) of light emitted from one of the plurality of subpixel regions 100 from transmitting into an adjacent subpixel region of the plurality of subpixel regions 100.

In one example, as shown in FIG. 4, the recess R is a through-hole via extending through the planarization layer 3, e.g., the pixel definition layer 7 and the planarization layer 3 are substantially on a same horizontal plane, and the depth D of the recess R is substantially the same as the thickness of the planarization layer 3.

In another example, as shown in FIG. 5, the recess R is a blind via partially extending into the planarization layer 3, e.g., the pixel definition layer 7 is on a side of the planarization layer 3 distal to the plurality of thin film transistors 23, and the depth D of the recess R is less than the thickness of the planarization layer 3. By having this design, the inter-subpixel region 200 of the display substrate can be at least partially planarized. Moreover, the segment difference between the pixel definition layer 7 and the planarization layer 3 is relatively small, avoiding issues caused by a steep slope in this region during the step of forming the pixel definition layer 7.

The greater the depth D of the recess R, the more effective it blocks light leakage between adjacent subpixel regions. To achieve an excellent light leakage blocking, in some embodiments, a ratio of the depth D of the recess R to the thickness of the planarization layer 3 is in a range of approximately 0.4:1 to approximately 1:1, e.g., approximately 0.4:1 to approximately 1:1, approximately 0.6:1 to approximately 1:1, approximately 0.7:1 to approximately 1:1, approximately 0.8:1 to approximately 1:1, approximately 0.9:1 to approximately 1:1, approximately 0.4:1 to approximately 0.9:1, approximately 0.4:1 to approximately 0.9:1, and approximately 0.4:1 to approximately 0.99:1.

The wider the recess R, the more effective it blocks light leakage between adjacent subpixel regions. To achieve an excellent light leakage blocking and a relatively high aperture ratio, the recess R in some embodiments has a width W in a range of approximately 1 μm to approximately 30 μm, e.g., approximately 1 μm to approximately 10 μm, approximately 10 μm to approximately 20 μm, approximately 20 μm to approximately 30 μm.

In some embodiments, the display substrate further includes a color filter between the plurality of organic light emitting diodes and the base substrate. Referring to FIG. 4 and FIG. 5, the color filter 20 is between the planarization layer 3 and the plurality of thin film transistors 23. Optionally, the color filter comprises a plurality of color filter blocks, each of which substantially in one of the plurality of subpixel regions 100. FIG. 4 and FIG. 5 show two of the plurality of color filter blocks, e.g., a red color filter block 21 and a green color filter block 22.

In some embodiments, the display substrate is an organic light emitting diode display substrate, and further includes a plurality of organic light emitting diodes respectively in the plurality of subpixel regions 100. In some embodiments, each of the plurality of organic light emitting diodes includes a first electrode 4 on the planarization layer 3; an organic light emitting layer 5 on a side of the first electrode 4 distal to the planarization layer 3; and a second electrode 6 on a side of the organic light emitting layer 5 distal to the first electrode 4. Optionally, the pixel definition layer 7 extends into the recess R to a depth D substantially blocking light emitted from the organic light emitting layer 5 of one of the plurality of organic light emitting diodes from transmitting into an adjacent subpixel region of the plurality of subpixel regions 100.

The organic light emitting layer 5 emits light when driven by an electrical potential difference between the first electrode 4 and the second electrode 6. Optionally, the organic light emitting layer 5 is a white light organic light emitting layer. Optionally, the organic light emitting layer 5 is an organic light emitting layer emitting light of a single color, e.g., a red light, a green light, and a blue light.

Optionally, the first electrode 4 is an anode, and the second electrode 6 is a cathode. Optionally, the first electrode 4 is a cathode, and the second electrode 6 is an anode. Optionally, the first electrode 4 is electrically connected to a drain electrode of one of the plurality of thin film transistors 23. Optionally, the first electrode 4 is a transparent electrode. Optionally, the first electrode 4 is a metallic electrode. Optionally, the second electrode 6 is a metallic electrode. Optionally, the second electrode 6 is a transparent electrode.

In some embodiments, the display substrate is a bottom emission type display substrate, light emitted from the subpixel region 100 (e.g., the organic light emitting layer 5) emits out of the display substrate from the base substrate 1. Optionally, the first electrode 4 is a transparent electrode.

In some embodiments, the pixel definition layer 7 is made of a light shielding material. Optionally, the pixel definition layer 7 is made of a black material for absorbing light. Optionally, the pixel definition layer 7 is made of a material capable of reflecting light, thereby blocking light emitted from one of the plurality of subpixel regions 100 from transmitting into an adjacent subpixel region of the plurality of subpixel regions 100. Optionally, the pixel definition layer 7 is made of a material capable of both absorbing light and reflecting light.

Figure 6:
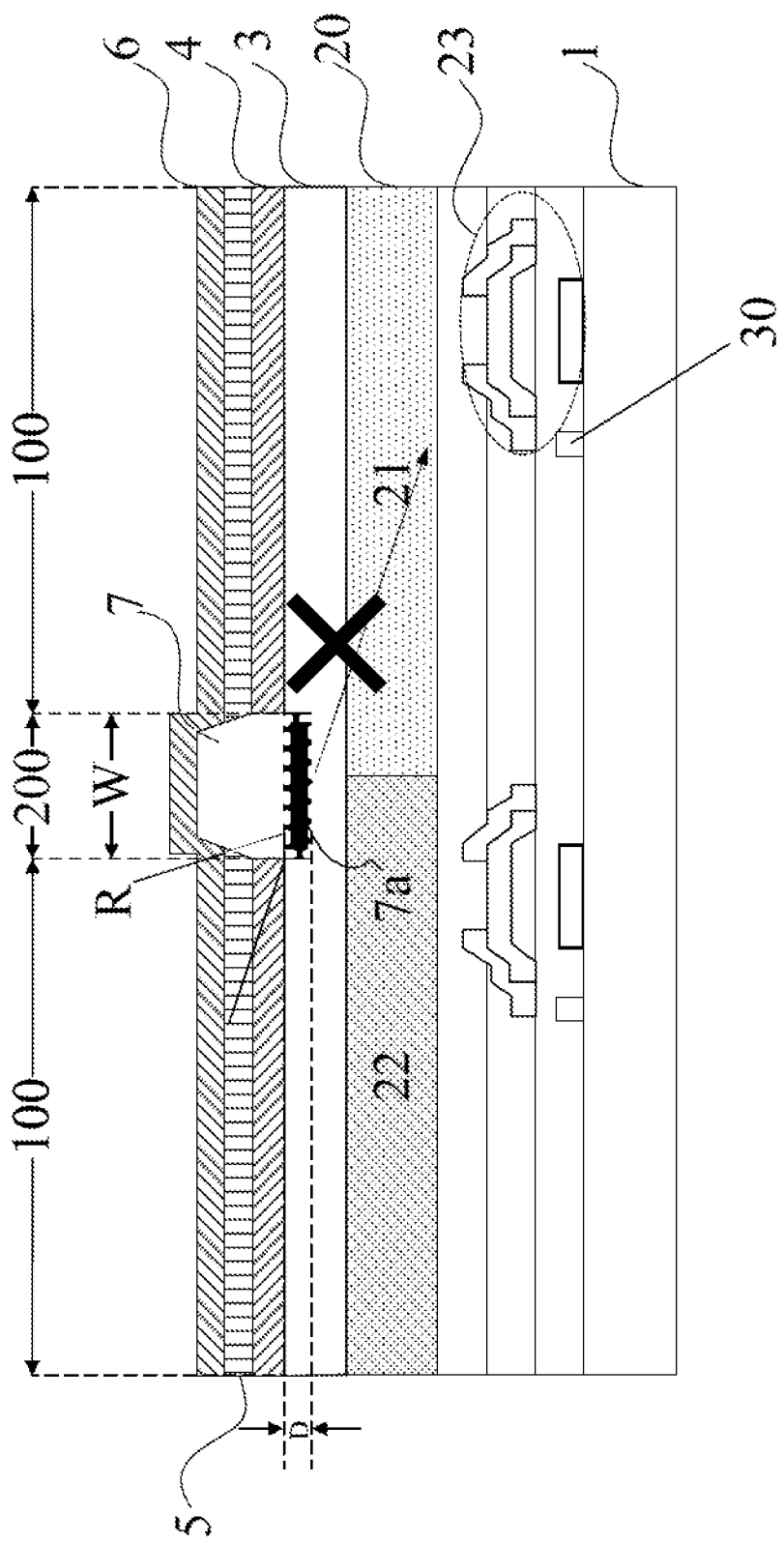
FIG. 6 is a schematic diagram illustrating the structure of a display substrate in some embodiments according to the present disclosure.

FIG. 6 is a schematic diagram illustrating the structure of a display substrate in some embodiments according to the present disclosure. Referring to FIG. 6, the display substrate in some embodiments includes a base substrate 1; a plurality of thin film transistors 23 for driving image display and a plurality of signal lines 30 on the base substrate 1; a planarization layer 3 on a side of the plurality of thin film transistors 23 distal to the base substrate 1; and a pixel definition layer 7 defining a plurality of subpixel regions 100. Optionally, the display substrate includes a recess R extending into the planarization layer 3. The recess R is in an inter-subpixel region 200 of the display substrate. The recess R is on a side of the planarization layer 3 proximal to the pixel definition layer 7, i.e., on a side of the planarization layer 3 distal to the base substrate 1. The display substrate further includes a recess fill layer 7a in the recess R. Optionally, the recess fill layer 7a fills in the recess R. Optionally, the recess fill layer includes a light shielding material. Optionally, the recess fill layer 7a is on a side of the planarization layer 3 proximal to the pixel definition layer 7, i.e., on a side of the planarization layer 3 distal to the base substrate 1. In some embodiments, an orthographic projection of the pixel definition layer 7 on the base substrate 1 substantially covers orthographic projections of the recess R and the recess fill layer 7a on the base substrate 1. Optionally, orthographic projections of the recess R and the recess fill layer 7a on the base substrate 1 substantially overlaps with an orthographic projection of the pixel definition layer 7 on the base substrate 1.

In some embodiments, the recess fill layer 7a and the pixel definition layer 7 are made of different materials. For example, the recess fill layer 7a is made of a light shielding material and the pixel definition layer 7 is made of a substantially transparent material. Optionally, the recess fill layer 7a and the pixel definition layer 7 are formed in two different patterning processes.

In some embodiments, the recess fill layer 7a extends into the recess R to a depth D substantially blocking light emitted from one of the plurality of subpixel regions 100 from transmitting into an adjacent subpixel region of the plurality of subpixel regions 100. By having this design, light emitted from the one of the plurality of subpixel regions 100 toward the adjacent subpixel region of the plurality of subpixel regions 100 will be blocked (e.g., absorbed or reflected) by the recess fill layer 7a in the recess R. Accordingly, light leakage and color mixing among adjacent subpixel regions of the plurality of subpixel regions 100 can be effectively avoided. Optionally, and as shown in FIG. 6, the recess R is a blind via partially extending into the planarization layer 3, e.g., the recess fill layer 7a is on a side of the planarization layer 3 distal to the plurality of thin film transistors 23, and the depth D of the recess R is less than the thickness of the planarization layer 3. Optionally, the recess R is a through-hole via extending through the planarization layer 3, e.g., the recess fill layer 7a and the planarization layer 3 are substantially on a same horizontal plane, and the depth D of the recess R is substantially the same as the thickness of the planarization layer 3. Optionally, a ratio of the depth D of the recess R to the thickness of the planarization layer 3 is in a range of approximately 0.4:1 to approximately 1:1, e.g., approximately 0.4:1 to approximately 1:1, approximately 0.6:1 to approximately 1:1, approximately 0.7:1 to approximately 1:1, approximately 0.8:1 to approximately 1:1, approximately 0.9:1 to approximately 1:1, approximately 0.4:1 to approximately 0.9:1, approximately 0.4:1 to approximately 0.9:1, and approximately 0.4:1 to approximately 0.99:1. Optionally, the recess R in some embodiments has a width W in a range of approximately 1 µm to approximately 30 µm, e.g., approximately 1 µm to approximately 10 Gun, approximately 10 µm to approximately 20 µm, approximately 20 µm to approximately 30 µm.

In another aspect, the present disclosure provides a method of fabricating a display substrate. In some embodiments, the method includes forming a plurality of thin film transistors for driving image display of the display substrate on a base substrate; forming a planarization layer on a side of the plurality of thin film transistors distal to the base substrate; and forming a pixel definition layer defining a plurality of subpixel regions. The display substrate is formed to comprise a recess extending into the planarization layer and in an inter-subpixel region of the display substrate. Optionally, the method further includes forming a recess fill layer in the recess. Optionally, the recess fill layer is formed to have a light transmittance rate lower than that of the planarization layer. Optionally, the recess fill layer is formed to be in direct contact with the pixel definition layer. Optionally, the recess fill layer is formed as an integral part of the pixel definition layer extending into the recess.

In some embodiments, the method further includes forming a pixel definition layer defining a plurality of subpixel regions. Optionally, the recess fill layer is formed as a part of the pixel definition layer extending into the recess. Optionally, the pixel definition layer is formed to extend into in the recess, e.g., a portion of the pixel definition layer is formed in the recess. Optionally, the recess is formed in an inter-subpixel region of the display substrate. Optionally, the pixel definition layer is formed to extend into the recess to a depth D substantially blocking light emitted from one of the plurality of subpixel regions from transmitting into an adjacent subpixel region of the plurality of subpixel regions. Optionally, the pixel definition layer is formed to completely fill the recess.

Optionally, the recess is formed so that a ratio of the depth D of the recess R to the thickness of the planarization layer 3 is in a range of approximately 0.4:1 to approximately 1:1, e.g., approximately 0.4:1 to approximately 1:1, approximately 0.6:1 to approximately 1:1, approximately 0.7:1 to approximately 1:1, approximately 0.8:1 to approximately 1:1, approximately 0.9:1 to approximately 1:1, approximately 0.4:1 to approximately 0.9:1, approximately 0.4:1 to approximately 0.9:1, and approximately 0.4:1 to approximately 0.99:1.

Optionally, the step of forming the recess includes forming a through-hole via extending through the planarization layer. Optionally, the step of forming the recess includes forming a blind via partially extending into the planarization layer, and the pixel definition layer is formed on a side of the planarization layer distal to the plurality of thin film transistors.

Optionally, the pixel definition layer and the recess are formed so that an orthographic projection of the pixel definition layer on the base substrate substantially covers an orthographic projection of the recess on the base substrate. Optionally, the pixel definition layer and the recess are formed so that an orthographic projection of the recess on the base substrate substantially overlaps with an orthographic projection of the pixel definition layer on the base substrate.

Optionally, the recess is formed to have a width in a range of approximately 1 µm to approximately 30 µm, e.g., approximately 1 µm to approximately 10 µm, approximately 10 µm to approximately 20 µm, and approximately 20 µm to approximately 30 µm.

In some embodiments, the method further includes forming a plurality of organic light emitting diodes respectively in the plurality of subpixel regions. Optionally, each of the plurality of organic light emitting diodes is formed to include a first electrode on the planarization layer; an organic light emitting layer on a side of the first electrode distal to the planarization layer; and a second electrode on a side of the organic light emitting layer distal to the first electrode. Optionally, the pixel definition layer is formed to extend into the recess to a depth D substantially blocking light emitted from the organic light emitting layer of one of the plurality of organic light emitting diodes from transmitting into an adjacent subpixel region of the plurality of subpixel regions.

In some embodiments, the method further includes forming a color filter between the plurality of organic light emitting diodes and the base substrate. Optionally, the step of forming the color filter includes forming a plurality of color filter blocks, each of which substantially formed in one of the plurality of subpixel regions.

Figure 7A:
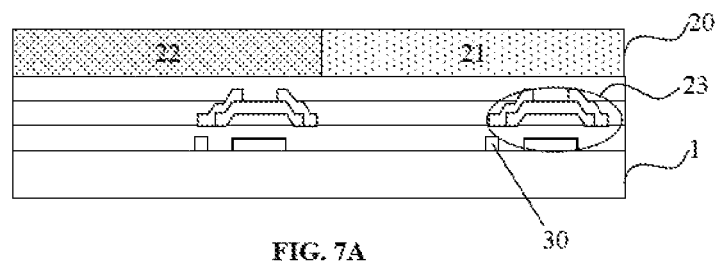
FIGS. 7A to 7D illustrate a process of fabricating a display substrate in some embodiments according to the present disclosure.

FIGS. 7A to 7D illustrate a process of fabricating a display substrate in some embodiments according to the present disclosure. FIGS. 8A to 8D illustrate a process of fabricating a display substrate in some embodiments according to the present disclosure. Referring to FIG. 7A and FIG. 8A, a plurality of thin film transistors 23 and a plurality of signal lines (e.g., gate lines and data lines) are formed on a base substrate 1. Subsequently, a color filter 20 is formed on a side of the plurality of thin film transistor 23 distal to the base substrate 1. The step of forming the color filter 20 includes forming a plurality of color filter blocks. e.g., a red color filter block 21 and a green color filter block 22. Optionally, the base substrate is made of glass or quartz. Optionally, each of the plurality of thin film transistors is formed to have a gate electrode connected to the corresponding gate line, and a source electrode connected to a corresponding data line.

Figure 7B:
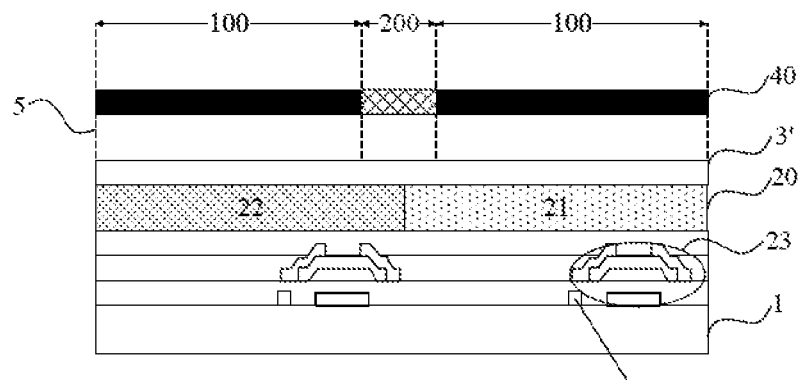
Figure 7C:
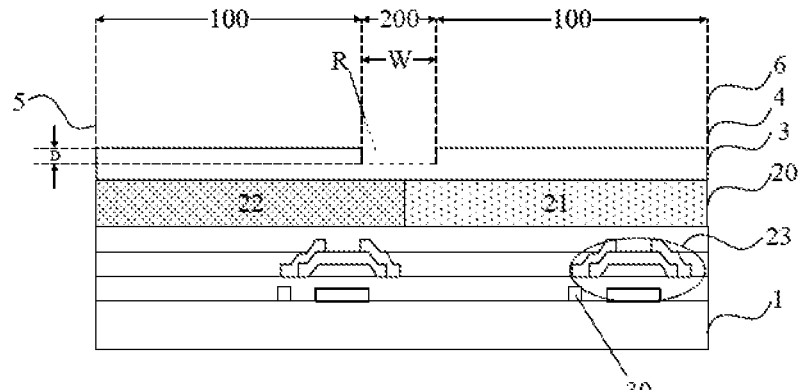
Figure 8A:
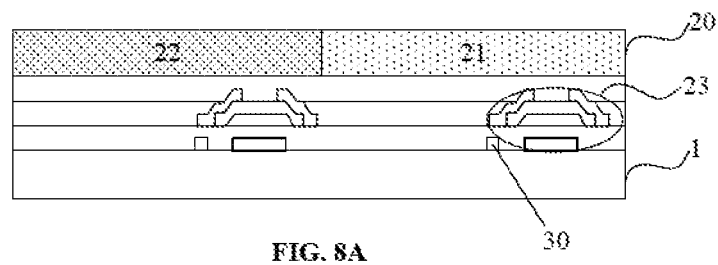
FIGS. 8A to 8D illustrate a process of fabricating a display substrate in some embodiments according to the present disclosure.
Figure 8B:
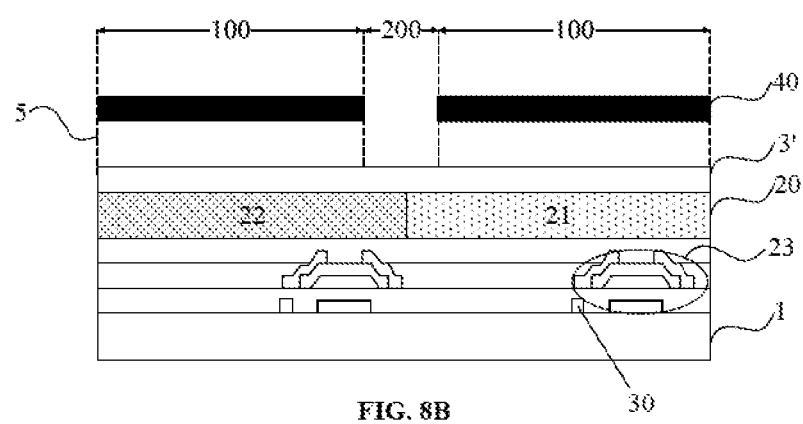
Figure 8C:
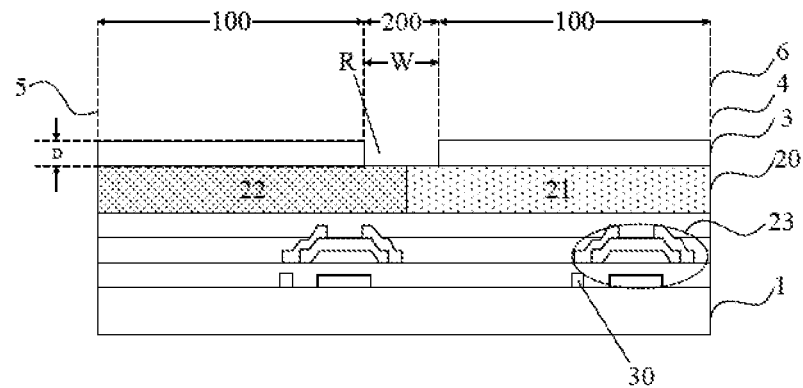

Referring to FIG. 7B and FIG. 8B, an insulating material layer 3' is formed on a side of the color filter 20 distal to the plurality of thin film transistor 23. Referring to FIG. 7C and FIG. 8C, a portion of the insulating material layer 3' in the inter-subpixel region 200 is removed, thereby forming the recess R. Referring to FIG. 7B, in some embodiments, a half-tone or gray-tone mask plate 40 is used, and the portion of the insulating material layer 3' in which the recess R is to be formed is partially exposed, and the remainder of the insulating material layer 3' is unexposed. Referring to FIG. 7C, the recess R formed is a blind via. Referring to FIG. 8B, in some embodiments, the portion of the insulating material layer 3' in which the recess R is to be formed is fully exposed. Referring to FIG. 8C, the recess R formed is a through-hole via. Referring to FIG. 7C and FIG. 5C, subsequent to forming the recess R, the planarization layer 3 is formed on a side of the color filter 20 distal to the plurality of thin film transistors 23. Optionally, the insulating material layer 3' is made of a photoresist material, e.g., a photoresist resin. Optionally, a photoresist layer is formed on the insulating material layer 3' to pattern the insulating material layer 3'.

Figure 7D:
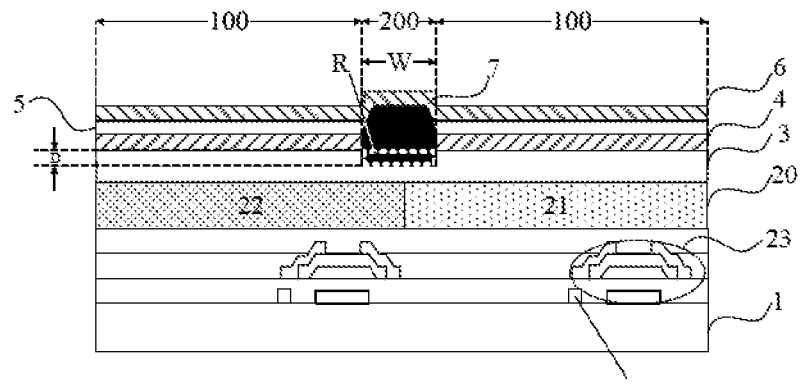
Figure 8D:
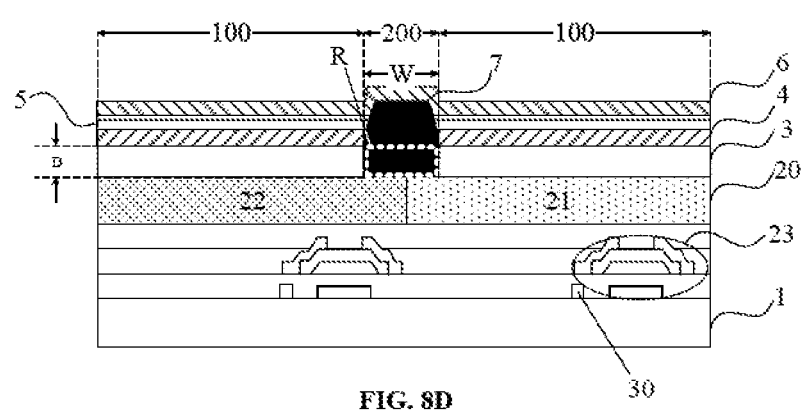

Referring to FIG. 7D and FIG. 8D, a pixel definition layer 7 is formed, thereby defining a plurality of subpixel regions 100 in the display substrate. The pixel definition layer 7 is formed to extend into the recess R, e.g., a portion of the pixel definition layer 7 is formed in the recess R. The recess R is formed in an inter-subpixel region 200 of the display substrate. Optionally, the pixel definition layer 7 is formed using a light shielding material.

A first electrode 4 is formed in each of the plurality of subpixel region 100, and is formed to electrically connected to a drain electrode of one of the plurality of thin film transistors 23. Optionally, the first electrode 4 is formed using a transparent conductive material.

An organic light emitting layer 5 is then formed on a side of the first electrode 4 distal to the planarization layer 3, and a second electrode 6 is formed on a side of the organic light emitting layer 5 distal to the first electrode 4.

In another aspect, the present disclosure provides a display panel having a display substrate described herein or fabricated by a method described herein. Optionally, the display panel is an organic light emitting diode display panel.

In another aspect, the present disclosure provides a display apparatus having a display substrate described herein or fabricated by a method described herein. Optionally, the display apparatus is an organic light emitting diode display apparatus. Examples of appropriate display apparatus includes, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention". "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
   a base substrate;
   a plurality of thin film transistors for driving image display on the base substrate;
   a planarization layer on a side of the plurality of thin film transistors distal to the base substrate; and
   a pixel definition layer defining a plurality of subpixel regions;
   wherein the display substrate comprises a recess extending into the planarization layer and in an inter-subpixel region of the display substrate;
   the display substrate further comprises a recess fill layer in the recess;
   the recess fill layer has a light transmittance rate lower than that of the planarization layer; and
   an orthographic projection of the pixel definition layer on the base substrate substantially covers an orthographic projection of the recess on the base substrate.

2. The display substrate of claim 1, wherein the recess fill layer is in direct contact with the pixel definition layer.

3. The display substrate of claim 1, wherein the recess fill layer is an integral part of the pixel definition layer extending into the recess.

4. The display substrate of claim 3, wherein the pixel definition layer extends into the recess to a depth; and
a ratio of the depth to a thickness of the planarization layer is in a range of approximately 0.4:1 to approximately 1:1.

5. The display substrate of claim 1, wherein the recess is a through-hole via extending through the planarization layer.

6. The display substrate of claim 1, wherein the recess is a blind via partially extending into the planarization layer; and
the pixel definition layer is on a side of the planarization layer distal to the plurality of thin film transistors.

7. A display substrate, comprising:
a base substrate;
a plurality of thin film transistors for driving image display on the base substrate;
a planarization layer on a side of the plurality of thin film transistors distal to the base substrate; and
a pixel definition layer defining a plurality of subpixel regions;
wherein the display substrate comprises a recess extending into the planarization layer and in an inter-subpixel region of the display substrate;
the display substrate further comprises a recess fill layer in the recess;
the recess fill layer has a light transmittance rate lower than that of the planarization layer; and
an orthographic projection of the recess on the base substrate substantially overlaps with an orthographic projection of the pixel definition layer on the base substrate.

8. The display substrate of claim 1, wherein the recess has a width in a range of approximately 1 µm to approximately 30 µm.

9. The display substrate of claim 1, further comprising a plurality of organic light emitting diodes respectively in the plurality of subpixel regions;
wherein each of the plurality of organic light emitting diodes comprises a first electrode on the planarization layer; an organic light emitting layer on a side of the first electrode distal to the planarization layer; and a second electrode on a side of the organic light emitting layer distal to the first electrode.

10. The display substrate of claim 9, wherein the display substrate is a bottom emission type display substrate; and
light emitted from the organic light emitting layer emits out of the display substrate from the base substrate along a direction away from the planarization layer.

11. The display substrate of claim 9, further comprising a color filter between the planarization layer and the base substrate;
wherein the color filter comprises a plurality of color filter blocks, each of which substantially in one of the plurality of subpixel regions; and
light emitted from the organic light emitting layer is a white light.

12. The display substrate of claim 1, wherein the pixel definition layer is made of a light shielding material.

13. A display apparatus, comprising the display substrate of claim 1.

14. A method of fabricating a display substrate, comprising:
forming a plurality of thin film transistors for driving image display of the display substrate on a base substrate;
forming a planarization layer on a side of the plurality of thin film transistors distal to the base substrate; and
forming a pixel definition layer defining a plurality of subpixel regions;
wherein the display substrate is formed to comprise a recess extending into the planarization layer and in an inter-subpixel region of the display substrate; and
the method further comprises forming a recess fill layer in the recess; and
the recess fill layer is formed to have a light transmittance rate lower than that of the planarization layer;
wherein forming the planarization layer comprises:
forming an insulating material layer on a side of the plurality of thin film transistors distal to the base substrate; and
removing a portion of the insulating material layer thereby forming the recess and the planarization layer;
wherein the recess is a blind via partially extending into the planarization layer; and
removing the portion of the insulating material layer comprises exposing the insulating material layer using a gray-tone or half-tone mask plate, the gray-tone or half-tone mask plate comprises a first section and a second section, a first part of the insulating material layer corresponding to the first section is partially exposed, a second part of the insulating material layer corresponding to the second section is substantially unexposed; and
developing the insulating material layer, thereby forming the recess and the planarization layer.

15. The method of claim 14, wherein the recess fill layer is formed to be in direct contact with the pixel definition layer.

16. The method of claim 14, wherein the recess fill layer is formed as an integral part of the pixel definition layer extending into the recess.

17. The method of claim 14, wherein removing the portion of the insulating material layer to a depth such that a ratio of the depth to a thickness of the insulating material layer is in a range of approximately 0.4:1 to approximately 1.1.

* * * * *